United States Patent [19]

Naitoh

[11] Patent Number: 4,617,527
[45] Date of Patent: Oct. 14, 1986

[54] PU LOCK ACQUISITION WITH SCAN RESTART UPON FALSE LOCK

[75] Inventor: Ryuichi Naitoh, Saitama, Japan

[73] Assignee: Pioneer Electronic Corporation, Tokyo, Japan

[21] Appl. No.: 744,649

[22] Filed: Jun. 13, 1985

Related U.S. Application Data

[63] Continuation of Ser. No. 507,640, Jun. 27, 1983, abandoned.

[30] Foreign Application Priority Data

Jun. 25, 1982 [JP] Japan ............................ 57-109338

[51] Int. Cl.$^4$ .............................................. H03L 7/06
[52] U.S. Cl. ........................................ 331/4; 331/14; 331/17; 331/DIG. 2
[58] Field of Search ............ 331/4, 14, 17, 25, DIG. 2

[56] References Cited

U.S. PATENT DOCUMENTS

| | | |
|---|---|---|
| 4,000,476 | 12/1976 | Walker et al. .................... 331/4 X |
| 4,077,016 | 2/1978 | Sanders et al. ........................ 331/4 |
| 4,423,390 | 12/1983 | Waters ................................. 331/4 |
| 4,443,769 | 4/1984 | Aschwanden et al. ............ 331/4 X |

Primary Examiner—Eugene R. LaRoche
Assistant Examiner—D. C. Mis
Attorney, Agent, or Firm—Sughrue, Mion, Zinn, Macpeak, and Seas

[57] ABSTRACT

A phase locking circuit for effecting pull-in of a phase locked loop to a desired frequency component even in the presence of spurious signals includes a phase locked loop, a scanning circuit and a control circuit. The scanning circuit generates a scanning current to the phase locked loop which activates a voltage controlled oscillator (VCO) therein, the VCO output being phase locked to an input signal by operation of the phase locked loop. The control circuit produces a periodic scanning restart signal causing the scanning circuit to periodically generate a second scanning current independent of the phase lock status of the phase locked loop until a phase lock to the desired frequency component is realized. The second scanning current functions to unlock a VCO output locked to a spurious signal.

8 Claims, 7 Drawing Figures

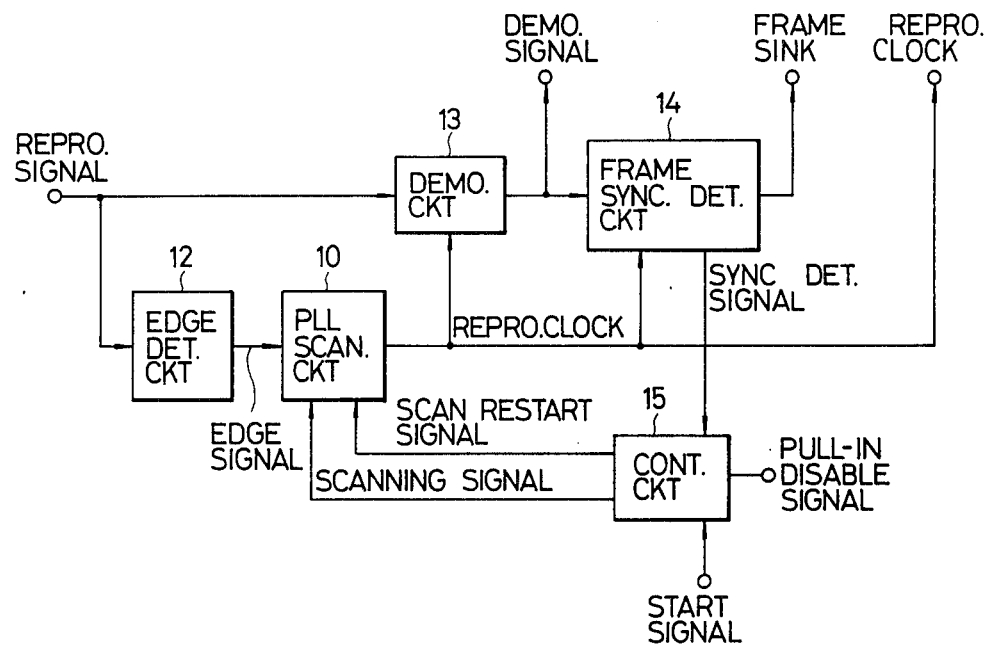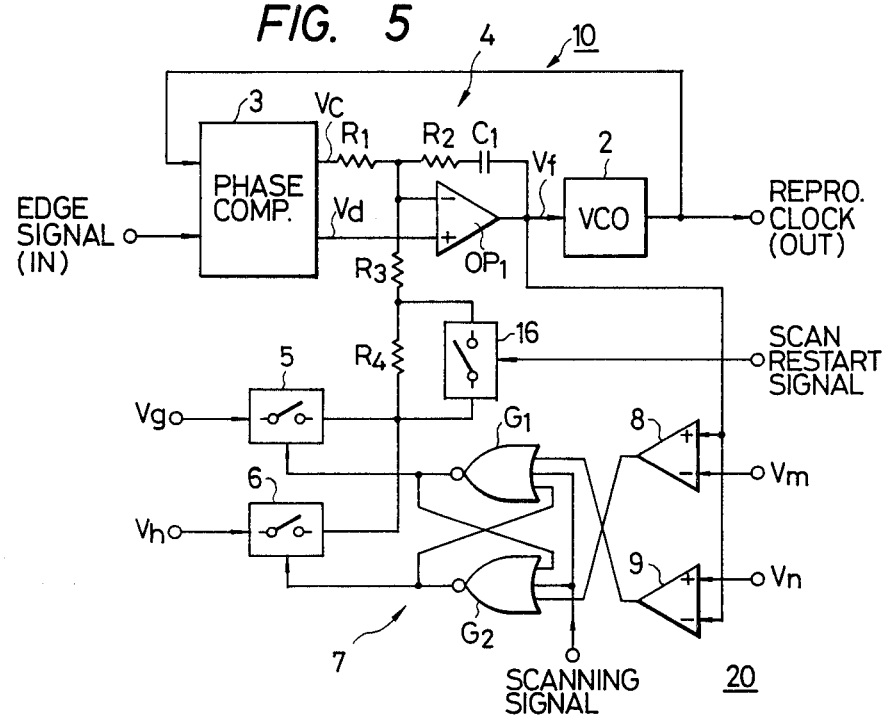

PU LOCK ACQUISITION WITH SCAN RESTART UPON FALSE LOCK

This is a continuation of application Ser. No. 507,640 filed Jan. 27, 1983, now abandoned.

FIELD OF THE INVENTION

The present invention relates to a pull-in control apparatus for phase locked loop circuits.

BACKGROUND OF THE INVENTION

To achieve a pull-in operation for a phase locked loop circuit, hereinafter referred to simply as PLL circuit, it is generally known to change the oscillation frequency of a voltage controlled oscillator, hereinafter referred to simply as VCO, by applying a scanning voltage, such as a triangular voltage waveforms, to the control input terminal of the VCO. This scanning voltage causes the VCO to scan its oscillating frequencies from its upper to its lower limits. An example of such a scanning apparatus for causing pull-in of PLL circuits is disclosed in Japanese Patent Application Laid-Open No. 56-69334 (Japanese Patent Application No. 54-146213).

FIG. 1 is a circuit diagram of the prior art scanning circuit disclosed in the aforementioned Japanese Patent Application. In the circuit, numeral 10 designates a PLL circuit. This circuit includes a phase comparator 3 outputting a difference signal corresponding to the difference in phase and frequency between the output signal OUT of a voltage controlled oscillator 2 and the input singal IN. The difference signal is applied to the inverted, that is negative, input terminal of a loop filter 4 composed of a differential amplifier $OP_1$, resistors $R_1$ and $R_2$, and a condenser $C_1$. The output (A) of the loop filter 4 is applied to the VCO 2 which operates to change the oscillation frequency of the VCO in accordance with the level of the control voltage.

Numeral 20 designates a scanning apparatus for causing pull-in of the PLL. In the circuit 20, D.C. voltages $V_g$ and $V_h$, each of a voltage level different from the other, are applied to the inverted input terminal of the loop filter 4 through selecting switches 5 and 6, respectively, and a resistor $R_3$. To control the selecting switches 5 and 6, there is provided an R-S flip-flop 7 composed of three-input NOR gates $G_1$ and $G_2$. The outputs (E) and (F) of gates $G_1$ and $G_2$, control the selecting switches 5 and 6, respectively.

Scanning circuit 20 also includes level comparators 8 and 9 for determining the upper and lower levels of the voltage level to be applied to the control voltage terminal of the VCO 2, the voltage level being the output (A) of the loop filter 4 as mentioned above. A reference voltage $V_m$ sets the upper voltage level and is applied to the inverted input terminal of the comparator 8. A reference voltage $V_n$ sets the lower voltage level and is applied to the non-inverted, that is, the positive input terminal of the comparator 9. The output (A) of the loop filter 4 is applied to the non-inverted input terminal of comparator 8 and the inverted input terminal of the comparator. The outputs (D) and (C) of comparators 8 and 9 are applied to the gates $G_2$ and $G_1$ of the flip-flop 7, respectively, to set or reset the gates $G_2$ and $G_1$, respectively.

Numeral 11 denotes a lock detector, generating a signal (B). Signal (B) assumes a logic high level in response to a phase lock condition in which the phase of the input signal IN is locked to the phase of the output signal OUT of the VCO 2. The output signal (B) thus becomes a clear signal applied to the gates $G_1$ and $G_2$ of the flip-flop 7.

As is conventional, the higher the level of the control voltage (A) to the VCO 2, the higher its oscillation frequency. The electronic switches 5 and 6 are caused to be in their closed or ON state producing a conductive path for voltages $V_g$ and $V_h$ to the negative input terminal of loop filter 4 when the respective control inputs (E) and (F) are at their high levels. The switches 5 and 6 are in their open or OFF state when the respective control inputs (E) and (F) are at their low levels. The D.C. voltages $V_g$ and $V_h$ are selected such that $V_g > V_d > V_h$, where $V_d$ is the voltage to be applied to the non-inverted or positive terminal of the loop filter 4, and represents the central value of the amplitude of the phase difference signal from the phase comparator 3, which is applied to the inverted input terminal of loop filter 4.

The operation of the circuit of FIG. 1 is explained hereinafter with reference to the waveforms shown in FIG. 2. In FIGS. 1 and 2 the same letter designates the same voltage or the same output. FIGS. 2(G) and 2(H) illustrate the ON-OFF switching operation of the switches 5 and 6, respectively. Up to the time $t_1$, the outputs (E) and (F) of the flip-flop 7 are low and high, respectively. Therefore, switch 5 is in its OFF state while switch 6 is in its ON state. As a result, the voltage $V_h$, lower than the D.C. voltage $V_d$, is applied to the inverted input terminal of the loop filter 4 and the loop filter 4 functions as an integrator for integrating the differential input $(V_d - V_h)$. The output (A) of the loop filter 4 is increased in accordance with the integration of the differential input causing the oscillation frequency of the VCO 2 to increase in accordance with the output (A).

At the time $t_1$, the voltage of the integrated output (A) reaches the reference voltage $V_m$ of the comparator 8, so that the output (D) of the comparator 8 is changed to a high level as shown in FIG. 2(D). Therefore, the output of the flip-flop 7 changes state to change the state of switch 5 to its ON state and the state of switch 6 to its OFF state. As a result, the differential input to the loop filter 4 becomes $(V_d - V_g)$, causing the integrated output (A) to be decreased since $V_d < V_g$. Correspondingly, the oscillation frequency of VCO 2 is also decreased. In this time, $t_1 - t_2$, the voltage of the output (A) is lower than the reference voltage $V_m$, so that the output of the comparator 8 returns to the low level instantaneously; but, this change does not affect the state of the flip-flop 7.

Therefore, the output (A) is continuously decreased until time $t_2$ at which time the level of the output (A) reaches the reference voltage $V_n$. At this point, the output (C) of the comparator 9 assumes a logic high level to invert the flip-flop 7. As a result, the switch 5 returns to its OFF state and the switch 6 returns to its ON state thereby once again causing the output (A) of the loop filter 4 to increase. As output (A) begins to increase, the output (C) of the comparator 9 changes almost instantaneously from its high level to its low level. However, the state of flip-flop 7 remains the same and is not inverted. At time $t_3$, when the phase of the input signal IN is coincident with the phase of the output signal OUT of the VCO, the output (B) of the lock detector 11 changes to a logic high level causing both of the outputs (E) and (F) of the flip-flop 7 to assume a logic low level. This causes both switches 5 and 6 to assume their open or OFF states. The PLL circuit now operates in its normal phase locked state.

With the scanning apparatus of FIG. 1 for pull-in of a PLL circuit, the desired operation can be achieved only when the input signal has only a bright line spectrum of the true frequency component to be locked within the scanning frequency, and does not contain a so-called spurious component as another bright line spectrum, or where, even if a spurious component is included therein, the energy of the spurious component is much less than the energy of the true bright line spectrum. However, where the input signal includes a high energy level spurious component in addition to the true bright line spectrum, the PLL circuit may lock onto the spurious component during the scanning operation causing what is termed herein as a mislock. Once the PLL circuit has been pulled in to the spurious component, normal lock to the true bright line spectrum is impossible until the energy of the spurious component is reduced.

An example of an input signal which can cause mislock is the reproduction signal produced by a record disc pre-recorded with a music signal modulated by the pulse 4 code modulation system. The so-called eight to fourteen modulation system, hereinafter referred to simply as EFM system, is one such pulse code modulation system. The digital signal is recorded on the record disc with a format as shown in FIG. 3. As shown in FIG. 3, one frame is composed of a plurality of channel bits, for example, 588 channel bits. The eight bit data signal is converted into 14 channel bits by the EFM system in accordance with a predetermined conversion table (not shown), to which is added a justification bit of 3 channel bits to make one unit composed of 17 channel bits. The units are recorded in the NRZI form, such that a transition from a logic level H to a logic level L or vice versa occurs in response to a bit at level 1, but no reverse is made when the bit is 0.

At the beginning of the frame, there is recorded the frame synchronizing signal. This signal is the first channel bit and is set to 1. The second to eleventh channel bits are set to 0, the twelfth channel bit is set to 1, the thirteenth to the twenty-second bits are set to 0, and the twenty-third channel bit to 1. A control signal referenced to the frame synchronizing signal is positioned at a predetermined location within the 588 channel bits. Signals are coded within a frame such that a "0" level lasting not less than 2 bit times nor more than 10 bit times is always preceded by a "1" level on one side and followed by a "1" level on its other. Namely, the minimum reverse interval is set to be 3T, where T being a period of one channel bit, and the maximum reverse interval is set to be 11T as shown in FIG. 3. Further, the data coding is designed that, except at the beginning of a frame, a maximum reverse interval of 11T never immediately follows another maximum reverse interval of 11T. It should be noted that, whether the frame synchronizing signal is initiated from a positive reverse from L to H or a negative reverse from H to L is determined by the state of the preceding signal.

In the portion at which the signal becomes a fixed pattern, corresponding to a zero level signal which may occur during the so-called intervals between music and the lead-in and the lead-out portions located at the outermost and the innermost tracks of a record disc, the mcdulated signal due to the EFM system becomes a time series signal having a repetitive pattern of 7T, 3T, 7T such that the pattern repeats every 17T. The signal obtained by differentiating the modulated signal and then fully rectifying it, includes a spurious signal with a comparatively high energy at n/17 times the clock frequency, n being an integer, less the bright line spectrum of the clock frequency. The channel bit rate in this case is 4.3218 MHz, and one over seventeen thereof becomes about 254 KHz. Therefore, the signal received by the PLL circuit in the non-music portion as mentioned above includes the spurious signal with the comparatively high energy of 4.3218 MHz±n×254 KHz (n is an integer) less the bright lines spectrum of 4.3218 MHz.

In the pull-in operation of the PLL circuit, if the lock operation is undesirably effected at the frequency of the spurious signal, it is impossible to correctly lock the true frequency until the spurious signal is eliminated. Namely, the PLL circuit does not correctly lock the true frequency until the signal of the non-music portion is received. Therefore, it is impossible to correctly decode data.

SUMMARY OF THE INVENTION

An object of the present invention is to provide a pull-in control apparatus for phase locked loop circuits in which the mislock state is removed and a correct lock is effected at the true frequency spectrum component to be locked.

The feature of the pull-in control apparatus for PLL circuits of the present invention resides in that in the case where a lock of the true spectrum component is not detected within a predetermined period of time from the initiation of the scanning operation, a scanning restart signal is applied to the PLL circuit to again initiate the scanning operation. In this way, a correct pull-in operation of the PLL circuit is achieved, even if the input signal of the PLL circuit includes a spurious signal.

BRIEF DESCRIPTION OF THE DRAWINGS

FIG. 4 is a block diagram showing an embodiment of the pull-in control apparatus according to the present invention;

FIG. 5 is a block diagram showing an embodiment of the scanning circuit according to the teachings of the invention with a conventional phase lock loop contract;

FIG. 6 is a block diagram showing an embodiment of the control circuit according to the teachings of the invention; and FIG. 7 shows waveforms for explaining the operation of the embodiments shown in FIGS. 4 through 6.

DETAILED DESCRIPTION OF THE PREFERRED EMBODIMENT

Figure 1:
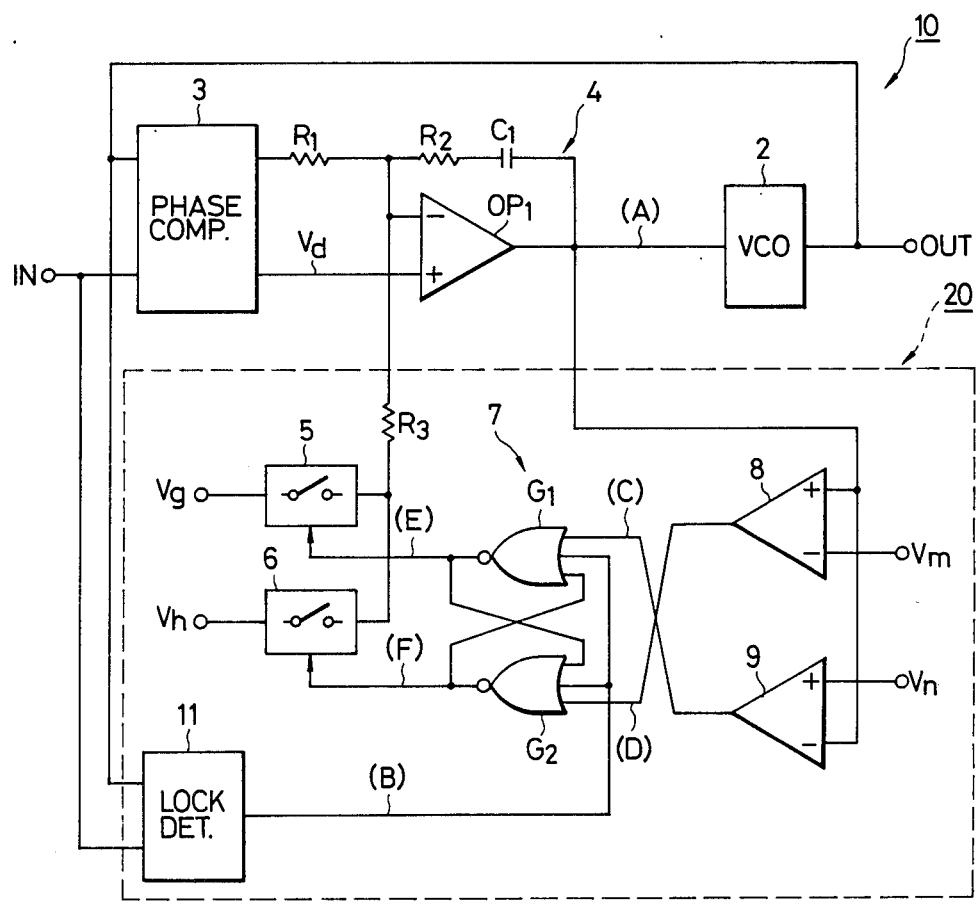
FIG. 1 is a block diagram showing a conventional scanning apparatus for a pull-in operation of a phase locked loop circuit.

FIG. 4 is a block diagram of an embodiment of the present invention applied to a digital audio-disc player. In FIG. 4, a reproduction signal from a pick-up (not shown) is applied to an edge detection circuit 12. The edge detection circuit 12 produces an edge signal with phaes information obtained by differentiating the reproduction signal and then fully rectifying it. A PLL circuit 10 is provided to extract a clock signal from the edge signal. There is provided a decoding circuit 13 for decoding the reproduction signal from the pick-up by using the extracted reproduction clock signal. The decoding signal is applied to a frame synchronism detecting circuit 14 to detect the frame synchronizing signal. It is well known to provide an arrangement whereby the detecting circuit 14 outputs a detection signal when the frame synchronizing signal is detected. The detection signal is inputted to a control circuit 15 which generates a scanning signal on receiving a start signal, and a scanning restart signal on the happening of a predetermined condition. The scanning signal and the scanning restart signals are inputted into a scanning circuit 20 illustrated in FIG. 5.

FIG. 5 illustrates an example of the PLL circuit 10 and the scanning circuit 20. In FIG. 5, those parts equivalent to those of FIG. 1 are denoted by the same reference numerals, and having been explained with reference to FIG. 1 will not be further explained with reference to FIG. 5. In FIG. 5, there is provided a resistor $R_4$ connected between the resistor $R_3$ and the switches 5 and 6. Resistor $R_4$ may be short-circuited by a switch 16. The switch 16 is controlled by the scanning restart circuit from the control signal 15 and is set to its ON state upon receiving a logic high level signal from the control circuit 15. According to a further feature of the invention, the common input to the gates $G_1$ and $G_2$ receives not the detection signal from the lock detector 11 of FIG. 1 (corresponding to frame synch detection circuit 14 of FIG. 4) but the scanning signal from the control circuit 15.

FIG. 6 is a block diagram showing the details of a control circuit 15. Control circuit 15 includes a flip-flop 17 having a set input (S) receiving the start signal for starting the pull-in operation of the PLL circuit, and a reset input (R) receiving the detection signal from the frame synchronism detecting circuit 14. The output $Q_1$ of the flip-flop 17 is a low level in a set-state. The control circuit 15 also includes an oscillator 18 capable of being reset when the output $Q_1$ of the flip-flop 17 is at its high level. The output $Q_2$ of the oscillator 18 is at a low level while the output $Q_1$ of flip-flop 17 is at a high level to thereby reset the oscillator 18. On the other hand, when the output $Q_1$ is at the low level, the oscillator 18 is actuated to output the signal $Q_2$ with a repeating signal having a low level with a time interval $T_1$ and a high level with a time interval $T_2$. The oscillating output signal $Q_2$, operates as the scanning restart signal which controls the switch 16 of the scanning circuit 20. Output signal $Q_2$ also functions as a clock input (ck) to a counter 19. When the counted value of the counter 19 reaches to a predetermined value, the output $Q_3$ of the counter 19 assumes a logic high level to generate a pull-in disabling signal. The output $Q_1$ of the flip-flop 17 is used as the scanning signal to be applied to the scanning circuit 20.

Figure 2:
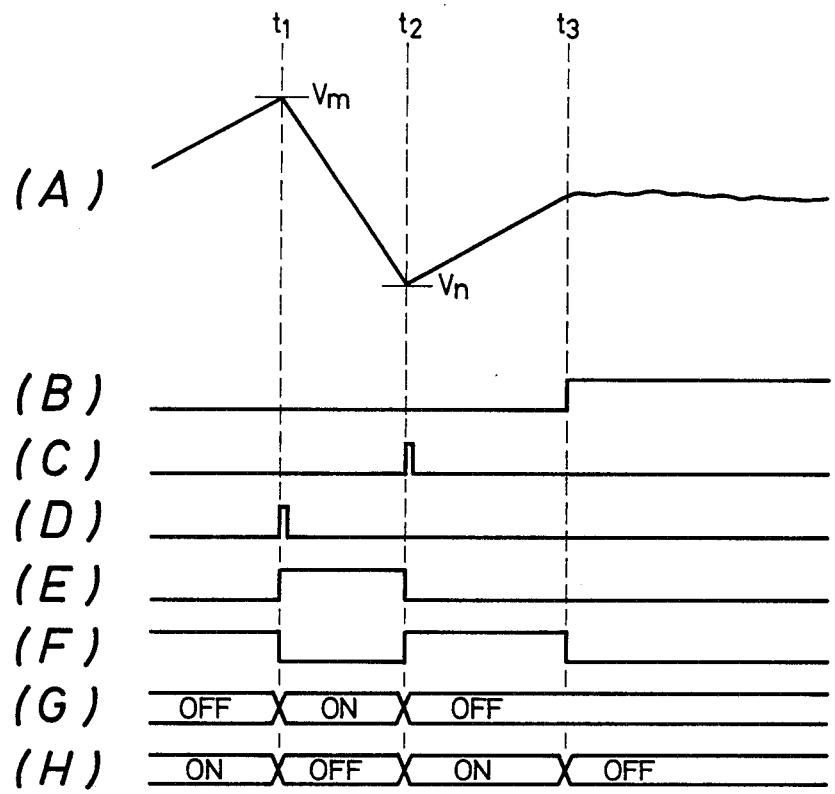
FIG. 2 shows waveforms for explaining the operation of the circuit shown in FIG. 1.
Figure 3:
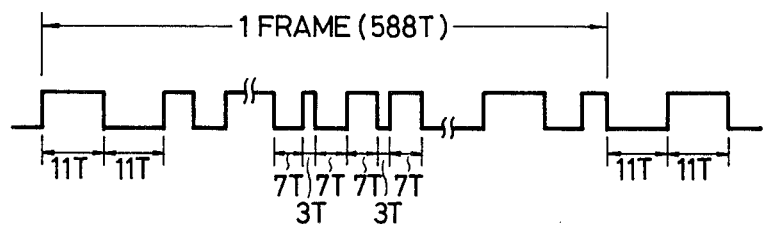
FIG. 3 shows an example of a digital modulation signal.

The operation of the circuits illustrated in FIGS. 4 to 6 will now be explained with reference to the timing chart of FIG. 7. When the externally generated start signal is received at time $t_1$, the flip-flop 17 is set, to change the output $Q_1$, i.e., the scanning signal, of the flip-flop 17 from the high level to the low level. As a result, the flip-flop 7 (FIG. 5) composed of the gates $G_1$ and $G_2$ is actuated to set one of the switches 5 and 6 to its ON state. Simultaneously, the oscillator 18 begins to produce the oscillating signal $Q_2$ to generate the scanning restart signal, which is at a low level for the interval $T_1$, from time $t_1$ to time $t_2$, and is at a high level for the interval $T_2$, from time $t_2$ to time $t_3$. Thus, the scanning restart signal is at a low level during the period $t_1$ to $t_2$, causing the switch 16 to be in its OFF state. Therefore, the time constant of the loop filter 4 is dependent on the resistance value of the series circuit comprised of the resistors $R_3$ and $R_4$. This time constant sets a suitable scanning rate as mentioned hereinbefore with respect to FIGS. 1 and 2. If a frame synchronism detecting signal is not received during the interval $T_1$, after the initiation of the scanning operation, the flip-flop 17 is not reset and, thus, maintains its set state. Therefore, the oscillator 18 continues to generate the output $Q_2$, which assumes a high level at time $t_2$. When $Q_2$ goes to its high level, switch 16 is switched to its ON state, and remains in this state during interval $T_2$, from time $t_2$ to time $t_3$. With switch 16 ON, the resistor $R_4$ is short-circuited. As a result, a more rapid scanning rate determined by the value of resistor $R_3$ is effected.

The counter 19 is adapted to operate such that the contents of the counter 19 goes to 1 from 0 at the time $t_2$. The scanning restart signal becomes a low level signal at the time $t_3$, so that the PLL circuit again starts the scanning operation with a suitable scanning rate decided by the resistors $R_3$ and $R_4$. Assuming that the PLL circuit is mislocked to a spurious component such that the control voltage $V_f$ of the VCO goes to $V_y$ at the time $t_4$, should this occur, a correct reproduction clock is not obtained. Therefore, the frame synchronism detecting signal is not detected and the frame synchronism detecting signal remains at low level. At the time $t_5$ the scanning restart signal again rises to a high level. As a result, the PLL circuit can be removed from the mislock state. The time interval $T_2$ is selected to be a time sufficient to remove the mislock state of the PLL circuit. The contents of the counter 19 changes from 1 to 2.

When the scanning restart signal again goes to its low level at a time $t_6$, the PLL circuit restarts again at a suitable scanning rate. Assuming that at a time $t_7$ the PLL circuit effects a correct lock to a correct spectrum component such that the control voltage $V_f$ of the VCO is the voltage $V_x$. In this case, a correct reproduction clock signal is obtained and, therefore, the frame synchronism detecting circuit 14 outputs the frame synchronism detecting signal after the lapse of the time interval $T_3$, i.e., at a time $t_8$. At the time $t_8$, the flip-flop 7 is reset and the output $Q_1$ goes high. As a result the switches 5 and 6 turn to the OFF state to stop the scanning operation. At this time, the oscillator 18 is also reset. Therefore, no scanning reset signal is generated and a correct lock operation of the PLL circuit is maintained.

At the time $t_8$ the counter 19 is also reset to zero. In this case, since the PLL circuit achieves the lock after three scanning operations, the contents of the counter 19 did not reach a predetermined value indicating no pull-in. If the predetermined count was reached the counter would produce a pull-in disabling signal. If the reproduction signal is not correctly obtained due to certain abnormal problems which might be caused by the record disk, and there is no voltage $V_x$ corresponding to the correct spectrum component between the scanning range decided by the voltages $V_m$ and $V_n$ because of a large deviation in the rotation speed of the record disk, it is necessary for the player to remedy the problem or at least display such abnormality. In this case, if the predetermined value in the counter 19 is set so that the counter $Q_3$ does not go to a high level when the apparatus is operating normally, it is possible to output the pull-in disabling signal even under abnormal conditions.

Referring here to the determination of the time interval $T_1$, if it is set to a value larger than the sum of the time required for the scanning voltage, $V_f$, to span the range between the levels $V_m$ and $V_n$, and the time interval $T_3$ from the time the PLL circuit locks to the proper frequency to the generation of the frame synchronism detecting signal, correct operation is assured even if the value $V_x$ is any of values between the values $V_m$ and $V_n$.

Determining the values of resistors $R_3$ and $R_4$ for setting the scanning rate will now be discussed. The value of resistor $R_3$ must be such that a mislock of the PLL circuit can always be removed by operation of one of the switches 5 and 6 and the switch 16, such that one of switches 5, 6 and switch 16 are simultaneously turned on. The proper value of the resistor $R_3$ is easily obtained from the maximum output voltage ($V_{cmax} - V_d$), the resistive value of the resistor $R_1$, and the voltages $V_g$ and $V_h$. The voltage $V_d$ is a constant value D.C. voltage, and the phase difference output voltage $V_c$ changes about the voltage $V_d$, that is, when the phase difference is zero, the voltage $V_c$ is equal to the voltage $V_d$ and when the phase difference is positive $V_c > V_d$. Assuming now that the sensitivity of the phase comparator 3 is P volt/radian, and a phase comparing range is set as $\pm \pi$ radian, the maximum output voltage ($V_{cmax} - V_d$) is $\pm \pi \times P$. The positive phase input voltage of the operational amplifier $OP_1$ is $V_d$, so that the inverted input voltage is also $V_d$ because of equality of the voltage at the inverted input terminal and the voltage at the non-inverted input terminal in the case where the operational amplifier is used with negative feedback. Therefore, the current flowing through the resistor $R_1$ where there is no phase difference is also zero. The current is $\pm(\pi \times P/R_1)$ where the phase difference is at a maximum. When the switches 5 and 6 are ON, i.e., in their closed state, the inverse input voltage of the operation amplifier $OP_1$ is $V_d$, so that the current $(V_g - V_d)/R_3$ flows into the inverted input from the side of $V_d$. The control input $V_f$ of the VCO must be constant to maintain the lock or mislock of the PLL circuit. Therefore, to maintain the lock it is necessary to make the current flowing through the path connecting the inverted input and the output of the operational amplifier $OP_1$ zero. Thus, if the current flowing from terminal $V_g$ is larger than the maximum current flowing from the inverse input to the phase comparator, the difference current therebetween flows through the path connecting the inverted input and the output of the operational amplifier $OP_1$ to change the voltage $V_f$, which makes a lock operation of the PLL circuit impossible.

Therefore, a mislock of the PLL circuit can always be eliminated by setting the resistive value of the resistor $R_3$ as follows:

$$(V_g - V_d)/R_3 > \pi \times P/R_1$$

Namely, $$R_3 < R_1 \times (V_g - V_d)/(\pi \times P)$$

In other words, mislock can be removed by increasing the scanning rate to the extent such that the disturbance so as not to maintain the lock operation of the PLL circuit is produced. This may be considered to be the same as the case where the switches 6 and 16 are in their ON states.

Selecting the value of resistor $R_4$, will now be discussed. The value is set so as to obtain a suitable scanning rate so as to guarantee effecting lock of the PLL circuit by the sum $R_3 + R_4$ when the switch 16 is in its OFF state and one of the switches 5 and 6 is in its ON state. As is apparent from the explanations with respect to the resistor $R_3$, a constant current determined by the series resistance $R_3 + R_4$ flows between terminal $V_g$ or $V_h$ and the inverted input of $OP_1$. In order to cancel this current, the usual phase error remains between the edge signal and the reproduction clock signal. The value $R_4$ may be increased to so as to cause the phase error to become small to the extent that the usual phase error after the lock does not affect the data decoding operation, or it may be preferable to make the usual phase error zero by making the scanning signal a high level after confirmation of the lock and opening the switches 5 and 6 to stop the scanning operation.

In the above embodiment of the present invention the mislock is removed by increasing the scanning rate beyond the usual scanning rate of the PLL circuit by using the scanning restart signal. However, the scope of the present invention should not be limited thereto, and it is apparently an essential feature of the present invention that a restart signal capable of removing a mislock may be applied to any part within the PLL circuit.

Further in the above embodiment, a usual scanning operation is also stopped after obtaining the frame synchronism detecting signal. However, it may be possible to stop only the application of the scanning reset while maintaining the usual scanning operation if the usual phase difference can be allowed.

Further, in the above embodiment, the detection of an abnormal condition is made by counting the duration of the scanning reset signal. However, it may be preferable to generate the pull-in disabling signal when the frame synchronism detecting signal is not obtained within a predetermined time interval from the time $t_1$.

The above-mentioned embodiment relates to a reproduction apparatus, i.e., record player, for a PCM digital audio disk, but the present invention is in no way limited to such reproduction apparatus. As is apparent from the above explanation, the present invention is applicable to an apparatus, the input of which has a spurious spectrum beside a true spectrum.

As mentioned above, according to the present invention, in the case where a frame synchronism detecting signal is not detected within a predetermined time interval after an initiation of the scanning operation, a disturbance is repeatedly applied to the phase locked loop circuit to restart the scanning operation again, a correct lock operation of the phase locked loop circuit to the true spectrum can be surely achieved.

What is claimed is:

1. A pull-in control apparatus for phase locked loop circuits in which the input signal includes a spurious component in addition to a true frequency component to be locked, comprising:
   scanning means for generating a scanning control voltage in response to a scanning restart pulse;
   a voltage controlled oscillator in said phase locked loop circuit, a control input thereof receiving said scanning control voltage;
   lock detecting means for detecting the fact that said phase locked loop circuit has locked to said true frequency component, and for generating a lock detection signal;

scanning restart means for periodically applying said scanning restart pulse to said scanning means when said lock detection signal is not generated within a preselected period of time and for stopping the application of said scanning restart pulse to said phase locked loop circuit in response to the generation of said lock detection signal.

2. A pull-in control apparatus for phase locked loop circuits as claimed in claim 1, wherein said scanning restart means includes a variable band width loop filter and is constructed so as to increase the scanning rate of said scanning means in response to a scanning restart signal to said loop filter.

3. A pull-in control apparatus for phase locked loop circuits as claimed in claim 1, wherein the input signal to said phase locked loop circuit is a digital signal modulated by a modulation system capable of a self-clocking and includes a predetermined frame synchronizing signal, and said lock detecting means is a frame synchronism detecting circuit for generating the lock detection signal when said frame synchronizing signal is detected.

4. A pull-in control apparatus for phase locked loop circuits as claimed in claim 2, wherein the input signal to said phase locked loop circuit is a digital signal modulated by a modulation system capable of a self-clocking and includes a predetermined frame synchronizing signal, and said lock detecting means is a frame synchronism detecting circuit for generating the lock detection signal when said frame synchronizing signal is detected.

5. A phase locking circuit for effecting pull-in of a phase locked loop, said circuit comprising:
a phase locked loop comprising;
  a loop filter for producing a first scanning voltage,
  a phase comparator, and a scanning circuit which produces a first scanning current,
  a voltage controlled oscillator responsive to said scanning voltage,
  said loop filter receiving inputs from said phase comparator and from said scanning circuit, said scanning current terminating in response to a phase lock, said phase locking circuit further comprising: selectively energized circuit means for making said loop filter produce a second scanning voltage in the absence of said phase lock; and control means for periodically energizing said selectively energized circuit means if said phase lock does not occur within a preselected period of time.

6. The phase locking circuit of claim 4 wherein said control means comprises:
  scanning signal generating means for generating a scanning signal; and
  oscillator means responsive to said scanning signal for periodically generating a scanning restart pulse, said scanning restart pulse being coupled to said selectively energized circuit means for causing said circuit means to periodically produce said second scanning current.

7. The phase locking circuit of claim 6 wherein said control means further comprises counter means coupled to said oscillator means for counting said scanning restart pulses and for producing a pull-in disable pulse in response to a preset number of scanning restart pulses.

8. The phase locking circuit of claim 7 wherein said scanning signal generating means has a first input for receiving a start signal and a second input for receiving a phase lock signal representing phase lock to a desired frequency component, said phase locking circuit further including means coupling said scanning signal to said scanning circuit for causing said scanning circuit to generate said first scanning current in response to said start signal and to disable said scanning circuit and prevent generation of either of said first and second scanning currents in response to a phase lock signal representing phase lock to said desired frequency component.

* * * * *